United States Patent
Pfeuffer

(10) Patent No.: US 12,027,503 B2
(45) Date of Patent: Jul. 2, 2024

(54) COMPONENT AND METHOD FOR PRODUCING A COMPONENT

(71) Applicant: OSRAM OLED GMBH, Regensburg (DE)

(72) Inventor: Alexander F. Pfeuffer, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 621 days.

(21) Appl. No.: 17/271,645

(22) PCT Filed: Aug. 9, 2019

(86) PCT No.: PCT/EP2019/071472
§ 371 (c)(1),
(2) Date: Feb. 26, 2021

(87) PCT Pub. No.: WO2020/043466
PCT Pub. Date: Mar. 5, 2020

(65) Prior Publication Data
US 2021/0343683 A1     Nov. 4, 2021

(30) Foreign Application Priority Data
Aug. 27, 2018 (DE) ...................... 10 2018 120 881.2

(51) Int. Cl.
*H01L 25/075*     (2006.01)
*H01L 33/48*     (2010.01)
*H01L 33/62*     (2010.01)

(52) U.S. Cl.
CPC ........ *H01L 25/0753* (2013.01); *H01L 33/486* (2013.01); *H01L 33/62* (2013.01);
(Continued)

(58) Field of Classification Search
CPC ... H01L 25/0753; H01L 33/486; H01L 33/62; H01L 2224/75; H01L 2224/81191;
(Continued)

(56) References Cited

U.S. PATENT DOCUMENTS

| 4,999,077 A | 3/1991 | Drake et al. |
| 2007/0126016 A1 | 6/2007 | Chen et al. |

(Continued)

FOREIGN PATENT DOCUMENTS

| DE | 10105872 A1 | 9/2002 |
| DE | 102007043877 A1 | 1/2009 |

(Continued)

OTHER PUBLICATIONS

International Search Report issued for the PCT patent application No. PCT/EP2019/071472, dated Nov. 14, 2019, 5 pages (for informational purpose only).

(Continued)

*Primary Examiner* — Timor Karimy
(74) *Attorney, Agent, or Firm* — Viering, Jentschura & Partner mbB; Benjamin L. von Rueden

(57) ABSTRACT

A component having a carrier and at least one main body where the main body may include a semiconductor body and the carrier may have a mounting surface for arranging the mounting body thereon. A stopping structure may be arranged on the mounting surface and may project vertically beyond the mounting surface. The main body may be directly adjacent to the stopping structure such that the position of the main body is bounded along at least one lateral direction by the stopping structure.

8 Claims, 6 Drawing Sheets

(52) U.S. Cl.
CPC . *H01L 2224/75* (2013.01); *H01L 2224/81191* (2013.01); *H01L 2224/95* (2013.01); *H01L 2933/0033* (2013.01); *H01L 2933/0066* (2013.01)

(58) Field of Classification Search
CPC ......... H01L 2224/95; H01L 2933/0033; H01L 2933/0066
See application file for complete search history.

(56) References Cited

U.S. PATENT DOCUMENTS

| | | | |
|---|---|---|---|
| 2010/0171215 A1 | 7/2010 | Fischer et al. | |
| 2017/0222105 A1 | 8/2017 | Sperl et al. | |
| 2018/0182943 A1 | 6/2018 | Von Malm et al. | |
| 2018/0350788 A1 | 12/2018 | Rafael et al. | |
| 2019/0127155 A1* | 5/2019 | Brandl | B65G 47/90 |

FOREIGN PATENT DOCUMENTS

| | | | |
|---|---|---|---|
| DE | 102014110719 A1 * | 2/2016 | H01L 33/486 |
| DE | 102014110719 A1 | 2/2016 | |
| DE | 102015109755 A1 | 12/2016 | |
| DE | 102016004592 A1 | 10/2017 | |
| WO | 2017089349 A1 | 6/2017 | |

OTHER PUBLICATIONS

Meitl, Matthew A. et al., "Transfer printing by kinetic control of adhesion to an elastomeric stamp", Jan. 2006, pp. 33-38, Nature Materials, vol. 5, Issue 1.
German SearchReport issued for the DE patent application No. 10 2018 120 881.2, dated Apr. 15, 2019, 5 pages (for Informationla purpose only).
Prevatte, Carl et al.; "Pressure activated interconnection of micro transfer printed components", 2016, 6 pages, Applied Physics Letters, vol. 108.
Prevatte, Carl et al., "Pressure-Activated Electrical Interconnection during Micro-Transfer-Printing", IEEE, 2016, 7 pages, 2016 IEEE 66th Electronic Components and Technology Conference (ECTC).

* cited by examiner

COMPONENT AND METHOD FOR PRODUCING A COMPONENT

CROSS-REFERENCE TO RELATED APPLICATIONS

The present application is a national stage entry according to 35 U.S.C. § 371 of PCT application No.: PCT/EP2019/071472 filed on Aug. 9, 2019; which claims priority to German Patent Application Serial No.: 10 2018 120 881.2 filed on Aug. 27, 2018; all of which are incorporated herein by reference in their entirety and for all purposes.

TECHNICAL FIELD

A component, in particular an optoelectronic component, is disclosed. Furthermore, a method for producing a component, in particular an optoelectronic component, is provided.

BACKGROUND

For the integration of heterogeneous microsystems, component parts can be transferred from, for example, a semiconductor wafer to a target carrier using an adhering stamp or a plurality of adhering stamps. For producing a component, the component parts can be selectively and securely picked out from the semiconductor wafer using the adhering stamp or plurality of adhering stamps and placed on the target carrier before the adhering stamp or stamps is/are detached from the corresponding component part or component parts. To avoid shifting the positions of the component parts on the target carrier of the component, the detachment of the adhering stamp should be performed with great care. This requires more effort, in particular more time, for the production of the component or of the microsystem.

One object to be solved is to specify a component, in particular an optoelectronic component, which has a particularly high alignment accuracy. A further object is to specify a reliable and cost-efficient method for producing a component, in particular a component described here.

SUMMARY

According to at least one embodiment of the component, the main body comprises a semiconductor body. In particular, the component is provided for generating or detecting electromagnetic radiation. For example, the semiconductor body has an active zone which, during operation of the component, is configured for generating or detecting electromagnetic radiation, for example in the ultraviolet, visible or infrared spectral range. In particular, the main body is arranged directly on the carrier. It is possible that the component comprises a plurality of main bodies, each comprising a semiconductor body, wherein the main bodies are arranged in particular on the same carrier. In lateral directions, the main bodies are in particular spatially spaced from each other. For example, the main bodies are individually electrically contactable. However, it is possible that the main bodies are electrically conductively connected to each other.

A lateral direction is understood to be a direction that is in particular parallel to a main extension surface of the carrier, for example parallel to a main extension surface of the mounting surface of the carrier. A vertical direction is understood to be a direction that is perpendicular to the main extension surface of the carrier, for instance perpendicular to the mounting surface of the carrier. The vertical direction and the lateral direction are transverse or orthogonal to each other.

According to at least one embodiment of the component, the carrier has a mounting surface. The mounting surface is in particular an exposed surface for receiving the main body or main bodies. The mounting surface is an adhesive surface of the carrier, which in particular, is adapted to at least temporarily fix the position of the main body on the mounting surface.

According to at least one embodiment of the component, a stopping structure is formed on the mounting surface. Along the vertical direction, the stopping structure may protrude beyond the mounting surface. In particular, the main body is directly adjacent to the stopping structure. By such an arrangement, the position of the main body may be bounded by the stopping structure at least along a lateral direction.

According to at least one embodiment of the component, the stopping structure comprises at least one boundary element. In particular, the boundary element is adjacent to the main body, directly adjacent to the main body. The boundary element may bound the main body on the mounting surface along at least one lateral direction or along a plurality of lateral directions. The component or the carrier of the component may have a plurality of boundary elements. In particular, each of the boundary elements is uniquely assigned to a single main body, and vice versa. For example, the structural element does not have a boundary element that is simultaneously adjacent to two or more different main bodies. Alternatively, however, it is possible that the boundary element is formed, for example with respect to its geometry or spatial extent, in such a way that at least two or more main bodies can be adjacent to the same boundary element.

According to at least one embodiment of the component, the component comprises a plurality of main bodies on the same carrier. The main bodies can each be adjacent to the stopping structure, for example to exactly one boundary element of the stopping structure, as a result of which the positions of the individual main bodies are at least partially predetermined by the positions of the boundary elements. The boundary elements of the stopping structure can be used to optimize the alignment accuracy of the main body or main bodies on the mounting surface.

In at least one embodiment of the component, the component comprises a carrier and at least one main body, wherein the carrier comprises a mounting surface on which the main body is arranged. In particular, the main body comprises a semiconductor body. A stopping structure is formed on the mounting surface and projects beyond the mounting surface along the vertical direction. The main body is directly adjacent to the stopping structure, so that the position of the main body is bounded by the stopping structure at least along a lateral direction.

The stopping structure can increase the placement accuracy of the main body or of the main bodies on the mounting surface. If the main body or the plurality of main bodies is/are applied to the mounting surface using an adhering stamp or a plurality of adhering stamps, the main body or the plurality of main bodies can be sheared off at the stopping structure, for example, as a result of which the adhering stamp or stamps can be detached from the main body or main bodies in a simplified manner. The stopping structure serves in particular as a stop for the main body or for the main bodies when the stamp or the stamps is/are detached. Using the stopping structure, the stripping of the main body or main bodies from the adhering stamp or stamps is thus simplified, and as a result, a reliable and fast arrangement of the main body or of the main bodies on the carrier can be achieved.

According to at least one embodiment of the component, the stopping structure has at least one boundary element. The boundary element is in particular directly adjacent to the main body. The boundary element may have a vertical height equal to or less than a vertical height of the main body. For example, a ratio of the vertical height of the boundary element or the stopping structure to the vertical height of the main body is between 0.4 and 1 inclusive, such as between 0.6 and inclusive or between 0.8 and 1 inclusive. To detach the stamp, the main body may be sheared laterally at the boundary element.

In particular, a vertical height of the boundary element or of the stopping structure means a vertical extension of the boundary element or of the stopping structure above the mounting surface. In other words, the vertical height of the boundary element or of the stopping structure indicates the height that projects beyond the mounting surface. In this context, it is possible that the stopping structure, in particular the boundary element, has a subregion located below the mounting surface. A total vertical height of the stopping structure or of the boundary element results in particular from the vertical heights of the stopping structure or of the boundary element above and below the mounting surface.

According to at least one embodiment of the component, the stopping structure comprises a boundary element having a greater vertical height than a vertical height of the main body. In a non-limiting embodiment, in a plane view of the mounting surface, the boundary element partially covers the main body. The boundary element may have a curved, angled or branched shape. For example, in top view of the mounting surface and/or in sectional view, the boundary element is L-shaped. In sectional view, the boundary element is L-shaped, for example, and in particular rotated clockwise by 90° or by 180°. Such a boundary element has the shape of a collar structure. The stopping structure may have a plurality of such boundary elements.

According to at least one embodiment of the component, the main body has electrical contact surfaces on a surface of the main body facing the carrier. The electrical contact surfaces may be formed as surfaces of the electrical contact layers. In particular, the electrical contact surfaces are configured for electrically contacting the main body and the semiconductor body, respectively. The contact surfaces can be assigned to different electrical polarities of the main body or the component. It is possible that the electrical contact surfaces are arranged exclusively on the surface of the main body facing towards the carrier. For example, the main body is a semiconductor chip in particular with exclusive rear contact surfaces. For example, the main body is a flip chip.

According to at least one embodiment of the component, the carrier has electrical connection surfaces. In particular, the electrical contact surfaces of the main body are electrically conductively connected to the electrical connection surfaces of the carrier. The electrical connection surfaces of the carrier can be assigned to different electrical polarities of the component. For example, the connection surfaces are electrically conductively connected to conductive tracks of the carrier. It is possible that the connection surfaces are surfaces of the conductive tracks. Alternatively, it is possible that the electrical connection surfaces of the carrier are surfaces of through-contacts which extend, in particular, through the carrier or at least through a base body of the carrier, so that the through-contacts can be electrically contacted, for example, on a rear side of the carrier facing away from the main body. It is also possible for the connection surfaces to be surfaces of connection layers arranged on the carrier or on the base body of the carrier, wherein the connection layers are electrically conductively connected to the conductor tracks or to the through-contacts of the carrier.

According to at least one embodiment of the component, the component has a plurality of main bodies. The main bodies may be spaced apart from each other on the mounting surface. In a non-limiting embodiment, the stopping structure has a plurality of boundary elements. The main bodies may each be directly adjacent to one of the boundary elements, such that the positions of the main bodies are bounded along at least one lateral direction or along lateral directions by the associated boundary elements. For example, each of the main bodies is uniquely assigned to one of the boundary elements, and in particular vice versa. For example, the component is a heterogeneous microsystem comprising microelectronic component parts and/or circuits. The main bodies may be LEDs, in particular micro-LEDs.

According to at least one embodiment of the component, the carrier has an adhesive cover layer. In particular, the mounting surface is formed by a surface of the cover layer. In top view of the mounting surface, the cover layer may cover the electrical connection surfaces at least partially or completely. To establish electrical connections between the connection surfaces of the carrier with the electrical contact surfaces of the main body, the main body can be pressed into the cover layer in such a way that the electrical contact surfaces of the main body are in direct electrical contact with the electrical connection surfaces of the carrier. For example, the main body has contact layers with spikes that extend through the cover layer to the connection surfaces of the carrier.

According to at least one embodiment of the component, the cover layer is formed from an electrically insulating material. For example, the cover layer has an adhesive surface facing the semiconductor body. It is possible that the cover layer is formed from an adhesion promoting material. For example, the cover layer is formed from a so-called spin-on material. Such a cover layer is in particular free of topography steps and is in particular planar. In addition, such a material can have such a high degree of adhesiveness, which is in particular sufficient to adhere the main body to the mounting surface, in particular to adhere it temporarily.

According to at least one embodiment of the component, the stopping structure extends throughout the cover layer to the electrical connection surfaces. In a top view of the mounting surface, the stopping structure may partially cover the connection surfaces. In particular, the cover layer, the stopping structure and the connection layers having the connection surfaces are formed from different materials. The stopping structure can be formed on the connection surfaces before the cover layer is applied to the connection surfaces.

According to at least one embodiment of the component, the carrier has an adhesive cover layer, wherein the stopping structure is arranged on the cover layer. The stopping structure, which is formed in particular from an electrically conductive material, can be electrically insulated from the connection surfaces by the cover layer. Alternatively, it is possible for the stopping structure to be formed from an electrically insulating material.

According to at least one embodiment of the component, the stopping structure is formed as part of the cover layer. In particular, the cover layer is formed integrally, i.e. in one piece, with the stopping structure. The stopping structure can have a plurality of boundary elements which are formed as vertical elevations of the cover layer.

According to at least one embodiment of the component, the carrier has a base body. The base body can be formed from an electrically insulating material or from an electrically conductive material. The carrier may have electrical connection surfaces and an intermediate layer. In particular, the intermediate layer is arranged along the vertical direction between the base body and the connection surfaces or between the base body and the cover layer. For example, the intermediate layer is arranged along the vertical direction at least partially between the base body and the connection layers.

According to at least one embodiment of the component, the mounting surface of the carrier is formed by the electrical connection surfaces. The carrier can be free of the cover layer described above. In particular, the connection surfaces are partially freely accessible. The stopping structure may be arranged on the electrical connection surfaces. It is possible that the stopping structure and the connection layers comprising the connection surfaces are formed from the same material or from different materials. For example, the stopping structure is formed from a metal or of an electrically insulating material. In particular, the intermediate layer is formed from an electrically insulating material. The intermediate layer is electrically insulating. If the connection layers or the connection surfaces are located on the intermediate layer, they can be spatially separated from one another and/or electrically insulated from one another.

According to at least one embodiment of the component, the boundary element of the stopping structure is formed to be point-shaped, strip-shaped or angled in top view of the mounting surface. If the boundary element is strip-shaped or angled, it may have a lateral width which is in particular greater than a corresponding width of the main body. If the boundary element is point-shaped, the stopping structure may have a plurality of such point-shaped boundary elements to which the main body is directly adjacent. It is possible for a single main body to be adjacent to two or more than two, such as three or four, point-shaped boundary elements. In this case, the main body has a lateral width that is in particular larger than a corresponding lateral width of the point-shaped boundary element.

In at least one embodiment of a method of producing a component, a plurality of main bodies are provided. The main bodies may each comprise a semiconductor body. In a non-limiting embodiment, the main bodies are arranged on an auxiliary carrier such that the main bodies are configured to be detachable from the auxiliary carrier. In other words, the main bodies can be detached from the auxiliary carrier without being damaged. A carrier having a mounting surface for receiving at least one of the main bodies or for receiving the main bodies is also provided. A stopping structure is formed on the mounting surface and extends vertically beyond the mounting surface. Using an adhering stamp or a plurality of adhering stamps, at least one of the main body or the plurality of main bodies is transferred from the auxiliary carrier to the mounting surface of the carrier. The main body or the plurality of main bodies is sheared off at the stopping structure for detaching the adhering stamp or stamps from the main body or main bodies. The stopping structure thus acts as a boundary, stop, or obstacle in the shearing process so that the stamp can be reliably detached from the associated main body, particularly without shifting the position of the associated main body. After the stamp is detached from the main body, the main body is located in particular directly at the stopping structure. For example, the main body is in direct physical contact with a boundary element of the stopping structure.

According to at least one embodiment of the method, the stopping structure has a plurality of boundary elements. A plurality of main bodies are simultaneously detached from the auxiliary carrier using a plurality of adhering stamps and simultaneously transferred to the mounting surface. The main bodies are sheared off from the adhering stamps, in particular at the boundary elements, and are thereby detached therefrom. The stamps are in particular polymer stamps, silicone stamps or PDMS (polydimethylsiloxane) stamps. For example, the stamp has an exposed adhesive surface for receiving at least one of the main bodies. The stamp may be formed from an elastic, in particular stretchable, material. The boundary elements, on the one hand, simplify the stripping of the main bodies from the adhering stamps and, on the other hand, specify the positions of the main bodies on the mounting surface so that an arrangement of the main bodies on the mounting surface can be precisely adjusted.

According to at least one embodiment of the method, the main bodies are mechanically connected to the auxiliary carrier exclusively via breakable or detachable retaining structures. The retaining structures are formed in such a way that they release the main bodies, in particular under mechanical load, so that the main bodies can be detached from the auxiliary carrier and are thus formed to be transferable or printable. The mechanical load can be a tensile force or compressive force exerted on the retaining structure. For example, the retaining structures are formed with respect to their geometries and/or materials in such a way that they are mechanically breakable or detachable under mechanical load. The main bodies can be adhered to the stamps so that the main bodies can be picked out from the auxiliary carrier one after the other or in groups and transferred to the mounting surface of the carrier.

In particular, the retaining structures are directly adjacent to the main bodies. The retaining structures can be arranged laterally and/or below and/or partially above the respective main body. If the retaining structures are located below a main body, for example between the main body and the auxiliary carrier, in top view, the main body can partially or completely cover the retaining structures. If the retaining structures are located exclusively to the side of a main body, in a plane view of the auxiliary carrier, the retaining structures and the main body may be free of overlaps. It is possible that the retaining structure/s is/are formed in such a way that it/they is/are arranged partly laterally partly above the associated main body. After detachment from the auxiliary carrier, the main body may have residues or separation traces from the retaining structures.

According to at least one embodiment of the method, the stopping structure is temporarily formed on the mounting surface. After fixing the main body to the mounting surface, the stopping structure may be removed. For example, the stopping structure is removed after shearing the main body or the main body from the mounting surface. In a non-limiting embodiment, the stopping structure is formed from a lacquer material, in particular from a photo-structurable material. A stopping structure made of such a material can be easily structured on the mounting surface and, if necessary, subsequently removed from the mounting surface.

The method described herein for producing one or a plurality of components is particularly suitable for the production of a component described herein. The features described in connection with the component can therefore also be used for the method, and vice versa.

BRIEF DESCRIPTION OF THE DRAWINGS

The accompanying drawings serve to provide an understanding of non-limiting embodiments. The drawings illustrate non-limiting embodiments and, together with the description, serve to explain them. Further non-limiting embodiments and many of the intended advantages will become apparent directly from the following detailed description. The elements and structures shown in the drawings are not necessarily shown to scale relative to each other.

Figure 1A:
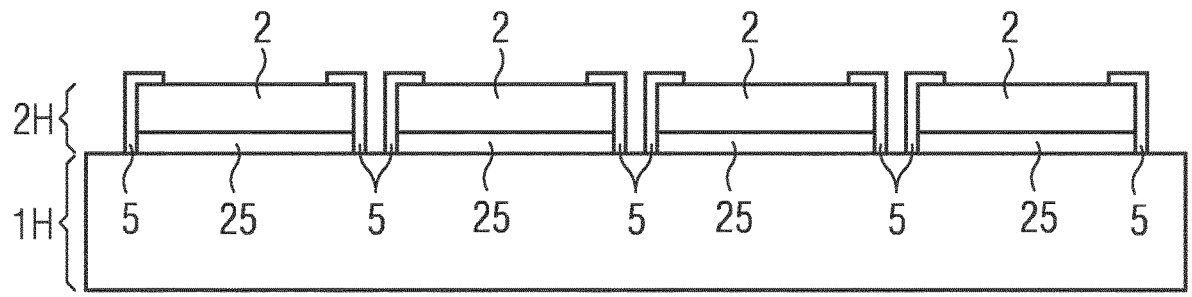
FIGS. 1A, 1B, 1C, 1D, 1E, and 1F show schematic illustrations of various method steps of a method for producing a component.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

DETAILED DESCRIPTION

In FIG. 1A, a plurality of main bodies 2H are arranged on an auxiliary carrier 1H. The main bodies 2H are spaced apart from each other in lateral directions. The main bodies 2H may each have a semiconductor body 2. In particular, the main bodies 2H are mechanically connected to the auxiliary carrier 1H via retaining structures 5. In a non-limiting embodiment, the main bodies 2H are mechanically connected to the auxiliary carrier 1 exclusively via the retaining structures 5. In other words, the retaining structures 5 are the only connecting elements between the auxiliary carrier 1 and the main bodies 2H. The retaining structures 5 are directly adjacent to the main bodies 2H and as well as to the auxiliary carrier 1H. In particular, the retaining structures 5 are formed to be mechanically breakable, so that the main bodies 2H are detachable from the auxiliary carrier 1H, for example, by breaking the retaining structures 5.

According to FIG. 1A, the main bodies 2H are each assigned with one of the retaining structures 5, and vice versa. The retaining structure 5 is arranged partly at the side of the associated main body 2H and partly on a surface of the associated main body 2H facing away from the auxiliary carrier 1H. In top view, the retaining structure 5 partially covers the surface of the associated main body 2H. Deviating from FIG. 1A, it is possible that the retaining structures 5 are arranged exclusively below the main bodies 2H or exclusively on the side of the main bodies 2H. In particular, an intermediate space 25, for instance a cavity 25, is located between the auxiliary carrier 1H and the associated main body 2H. In particular, the retaining structures 5 are directly adjacent to the intermediate space 25. The intermediate spaces 25 may previously be filled with a sacrificial layer which is removed after the retaining structures 5 have been formed. In particular, the retaining structures 5 are formed such that they are mechanically broken when the main bodies 2H are lifted or pressed down. The main bodies 2H can thus be removed from the auxiliary carrier 1 individually or in groups.

Figure 1B:
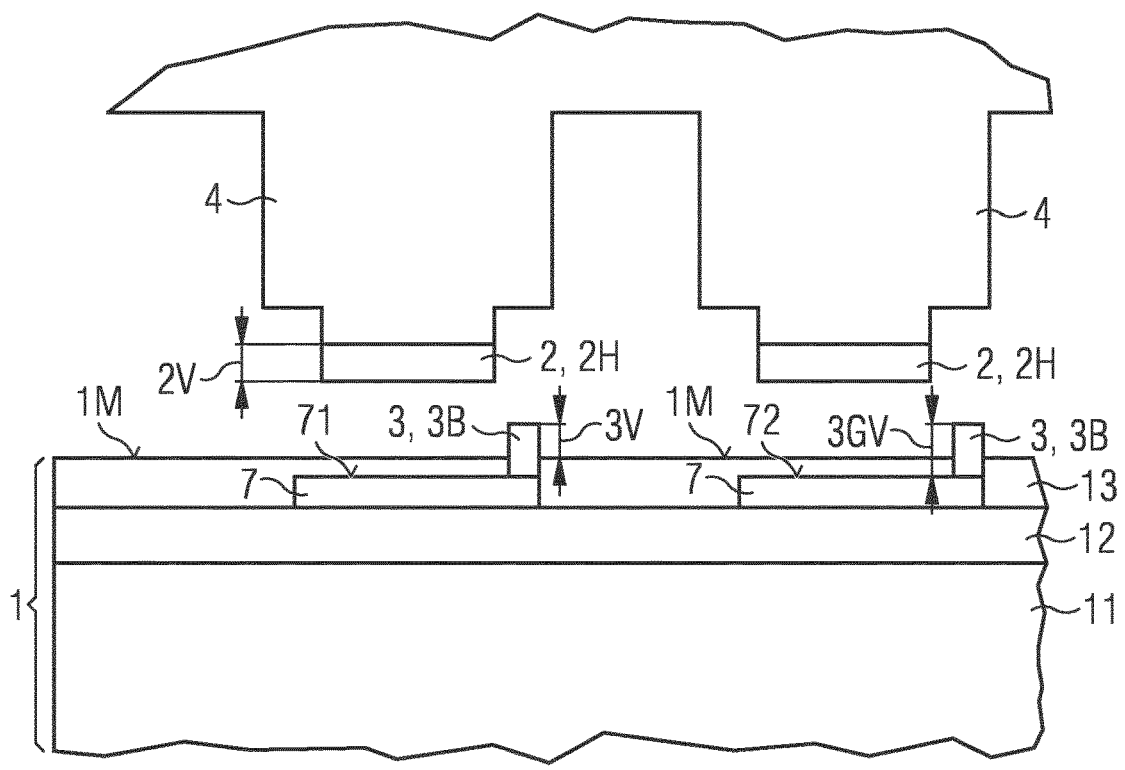

According to FIG. 1B, a carrier 1 is provided. The carrier 1 has a base body 11, an intermediate layer 12 and a cover layer 13. The carrier 1 also has a plurality of connection layers 7, wherein each of the connection layers 7 has a surface 71 or 72 facing away from the base body 11. The surfaces 71 or 72 may each be formed as a first connection surface 71 or a second connection surface 72 of the carrier 1. Along the vertical direction, the intermediate layer 12 is arranged between the base body 11 and the cover layer 13 or between the base body 11 and the connection layers 7. The intermediate layer 12 is in particular an electrically insulating layer.

In particular, the cover layer 13 is formed from an electrically insulating material and may have an adhesion promoter material. For example, the cover layer 13 is formed from an epoxy material, for instance from a so-called INTERVIA© material. In a non-limiting embodiment, the cover layer 13 is formed from a spin-on material which is applied to the base body 11, the intermediate layer 12 and/or to the connection layers 7, in particular by rotational coating. In particular, the cover layer 13 has a surface 1M which faces away from the base body 11 and is formed for instance as a mounting surface 1M of the carrier 1. In particular, the mounting surface 1M is an exposed and adhesive surface of the carrier 1. In a top view of the mounting surface 1M, the cover layer 13 can partially or completely cover the connection layers 7 or the connection surfaces 71 and 72.

The carrier 1 has a stopping structure 3 that projects beyond the mounting surface 1M along the vertical direction. Outside the stopping structure 3, the mounting surface 1M can be planar. Outside the areas of the stopping structure 3 and the areas configured for electrically contacting the main body 2H, in top view, the cover layer 13 may completely cover the connection layers 7 or the connection surfaces 71 and 72.

The stopping structure 3 has a plurality of boundary elements 3B. According to FIG. 1B, the boundary elements 3B extend throughout the cover layer 13 to the connection layers 7. The boundary elements 3B each have a total vertical height 3GV. The overall vertical height 3GV is thus also the overall vertical height of the stopping structure 3. From the mounting surface 1M, the boundary elements 3B extend beyond the mounting surface 1M by a vertical height 3V. The stopping structure 3 or the boundary element thus has a vertical height 3V above the mounting surface 1M.

According to FIG. 1B, the main bodies 2H are removed from the auxiliary carrier 1H, in particular by breaking or by detaching the retaining structures 5, either individually or in groups. For this purpose, an adhering stamp 4 or a plurality of adhering stamps 4 can be applied. The main bodies 2H can be adhered to the stamps 5, detached from the auxiliary carrier 1H and/or from the retaining structures 5 and transferred to the mounting surface 1M of the carrier 1 using the stamps 4, in particular in the same method step.

In particular, the main bodies 2H each have a for instance exposed surface which faces away from the auxiliary carrier 1H and is planar. The main bodies 2H can be attached to the stamps 4 by a direct bonding process. In particular, the stamps 4 are formed from a plastic material, for instance from an elastic material. In particular, the stamps 4 are configured such that they can be peeled from the main bodies 2H by a slow shearing motion, leaving the main bodies 2H on the mounting surface 1M. In this way, the main bodies 2H can be printed individually or in groups on the mounting surface 1M. In this sense, the main bodies 2H are formed to be printable.

According to FIG. 1B, the main body 2H has a vertical height 2V. In particular, the vertical height 2V of the main body is equal to or less than the vertical height 3V or the total vertical height 3GV of the associated boundary element 3B.

Figure 1C:
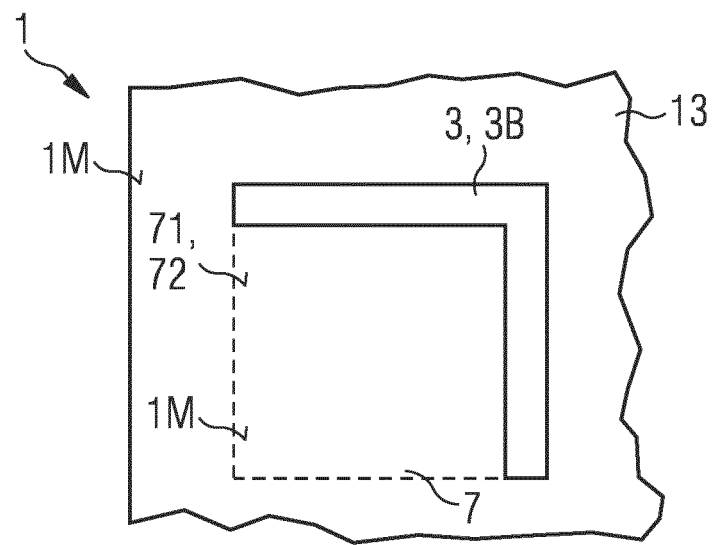

In FIG. 1C, the carrier 1 is schematically shown in a top view of the mounting surface 1M. The mounting surface 1M is formed by a surface of the cover layer 13. In a top view of the mounting surface 1M, the cover layer covers the underlying connection layers 7, in particular completely. The carrier 1 may have a plurality of connection layers 7 formed side by side, wherein on each of the connection layers 7 at least one boundary element 3B of the stopping structure 3 is arranged. In a top view of the mounting surface 1M, the boundary element 3B may partially cover the first connection surface 71 or the second connection surface 72.

In FIG. 1C, in a plane view of the mounting surface 1M, the boundary element 3B has the shape of an angled or branched strip on the connection surface 71 or 72. When a main body 2H is fixed on the mounting surface 1M or on the connection surface 71 or 72, the boundary element 3B may bound the main body 2H in at least one lateral direction or in two lateral directions. In deviation from FIG. 1C, the boundary element 3B may have other shapes, such as the shape of a simple strip, a curved strip, or a rectangle, for instance of a square. Alternatively, it is possible for the boundary element 3B to be point-shaped. The boundary elements 3B may be formed from a plurality of separate points, such as two, three or four points, on the mounting surface 1M, in particular on the same connection surface 71 or 72.

Figure 1D:
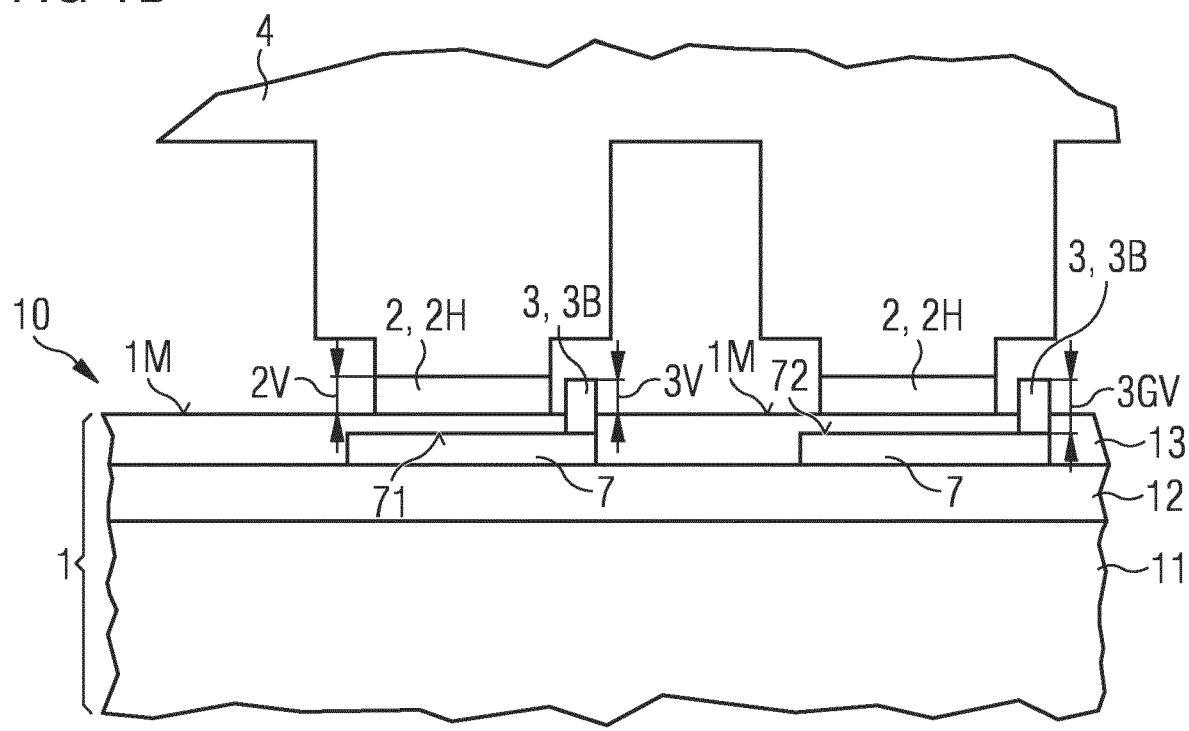
Figure 1E:
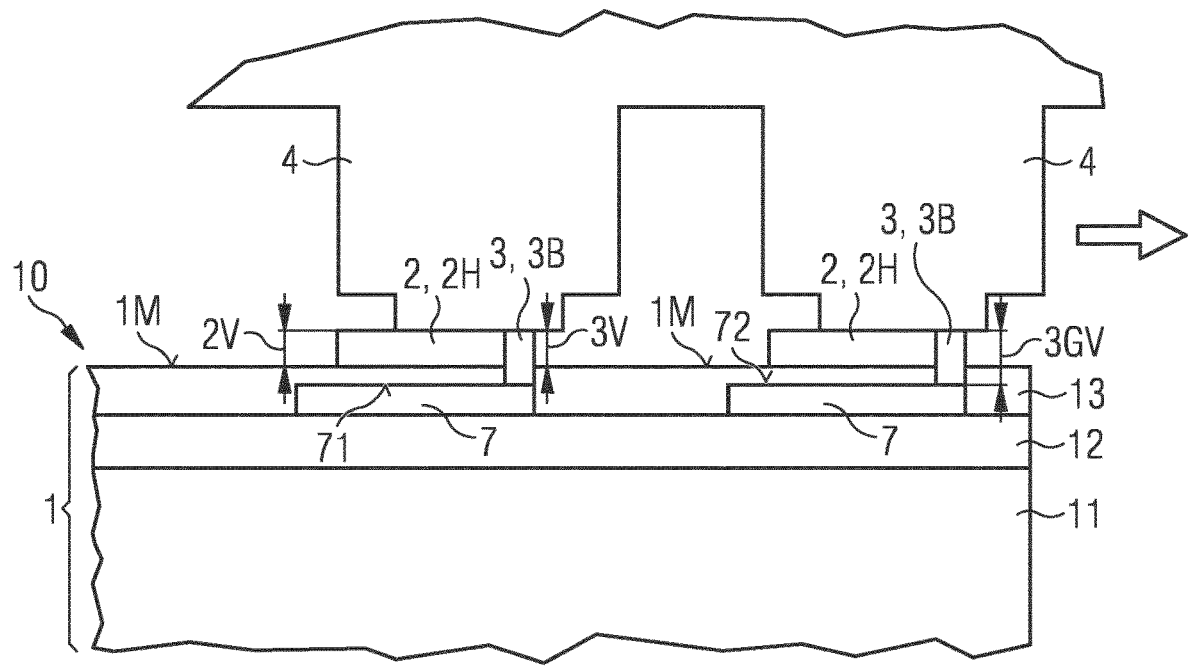

According to FIG. 1D, the main bodies 2H are placed on the mounting surface 1M. The main body 2H can initially be arranged on the mounting surface 1M in such a way that it is laterally spaced from the stopping structure, in particular from the boundary element 3B assigned to it. Thus, there is a lateral intermediate space between the main body 2H and the associated boundary element 3B. Thus, using the stamp 4, the position of the main body 2H on the mounting surface 1M is first optically adjusted. For example, the main body 2H is in direct physical contact with the mounting surface 1M or with the cover layer 13. In virtue of a lateral shearing movement, for instance as indicated by the arrow in FIG. 1E, wherein the main body 2H is moved laterally, for instance transversely to the main body orientation, up to the associated boundary element 3B, wherein the stopping structure 3 comprising the boundary element 3B acts as a stop or obstacle for the main bodies 2H, the stamp 4 or the stamps 4 can be detached, for instance peeled off, from the main body 2H or from the main bodies 2H. In other words, the main bodies 2H remain stuck to the boundary elements 3B and thus are directly adjacent to the boundary elements 3B or to the stopping structure 3. Misplacement of the main body 2H or of the main bodies 2H can thus be corrected.

Figure 1F:
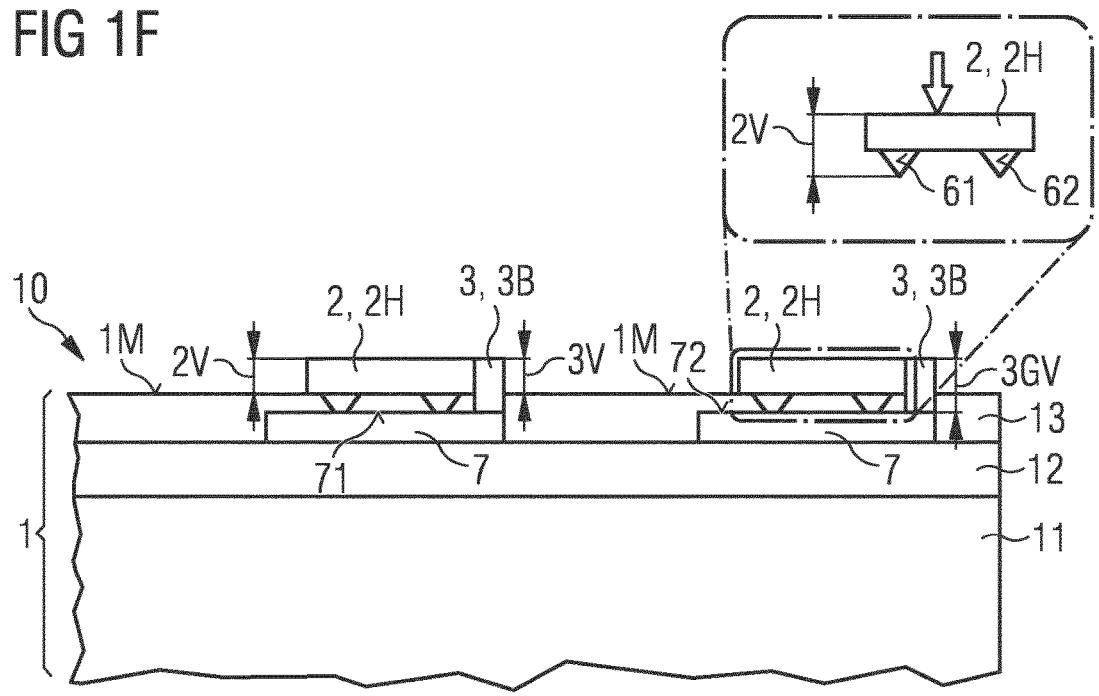

FIG. 1F schematically shows a component 10 in sectional view. The component 10 can be produced in particular by a method according to FIGS. 1A to 1E. The component 10 shown in FIG. 1F thus essentially corresponds to the exemplary embodiment for a component 10 shown in FIG. 1E. In contrast thereto, contact surfaces or contact points 61 and 62 are shown schematically in FIG. 1F. Such contact surfaces or contact points 61 and 62 may also be present on the components shown in FIGS. 1A to 1E, which are not shown only for the sake clarity. In particular, the contact surfaces or contact points 6, 61 and 62 are formed exclusively on a surface of the main body 2H facing the carrier 1. In particular, the main body 2H has a first contact surface 61 assigned to a first electrical polarity of the main body 2H or of the component 10. The main body 2H has a second contact surface 62, for instance assigned to a second electrical polarity, which different from the first electrical polarity, of the main body 2H or of the component 10.

The contact points 61 and 62 can each have the shape of a spike so that the contact points 61 and 62 can already pierce through the cover layer 13 by exerting a small amount of pressure and thus reach the connection surface 71 or 72. Deviating from this, it is possible for the contact points 61 and 62 to be flat, i.e. planar. Alternatively or additionally, it is possible that the contact surfaces 61 or 62 of the main body 2H can be brought into electrical contact with the underlying electrical connection surfaces 71 and 72 by annealing steps by exploiting the thermal shrinkage of the cover layer 13.

Figure 2A:
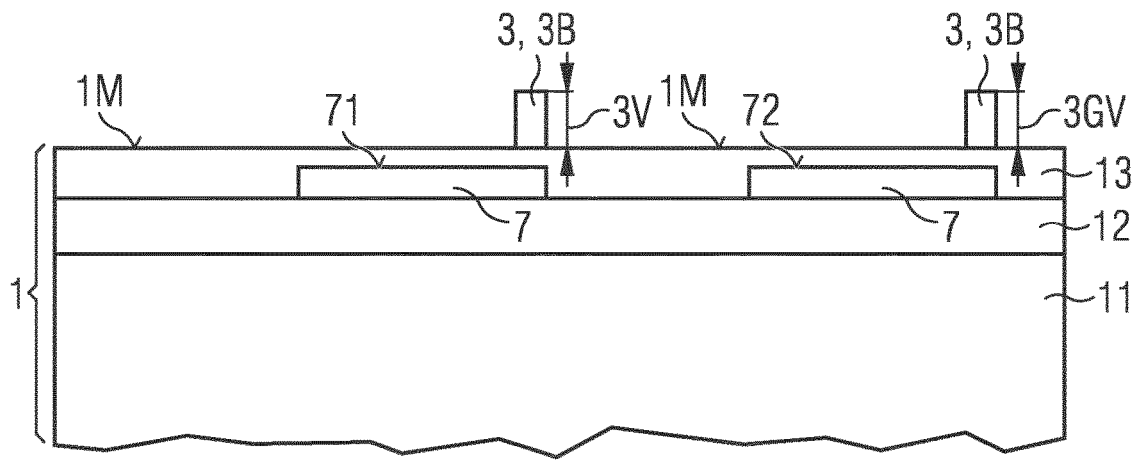
FIGS. 2A, 2B and 2C show schematic illustrations of a carrier of a component in sectional view and in top view of the mounting surface.

The exemplary embodiment for a carrier 1 shown in FIG. 2A essentially corresponds to the carrier 1 shown in FIG. 1A. In contrast, the stopping structure 3 is arranged on the cover layer 13, in particular exclusively on the cover layer 13. In particular, the boundary elements 3B of the stopping structure 3 do not extend into the cover layer 13 or throughout the cover layer 13. The cover layer 13 is located in the vertical direction in regions between the stopping structure 3 and the connection layer 7 associated with the boundary element 3B.

The stopping structure 3 is thus applied to the cover layer 13 only after the cover layer 13 has been formed. This has the advantage that the boundary elements 3B do not lead to disturbances in the flow of the material of the cover layer 13, for example, when the material of the cover layer 13 is overflowed. The stopping structure 3 may be formed from an electrically conductive material for example from a metal such as copper or gold. The stopping structure 3 is electrically insulated from the connection layers 7 by the cover layer 13 which, for instance, is formed to be electrically insulating.

Figure 2B:
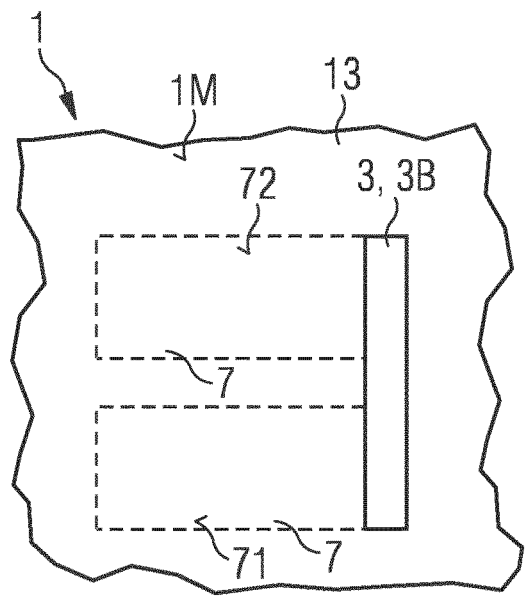
Figure 2C:
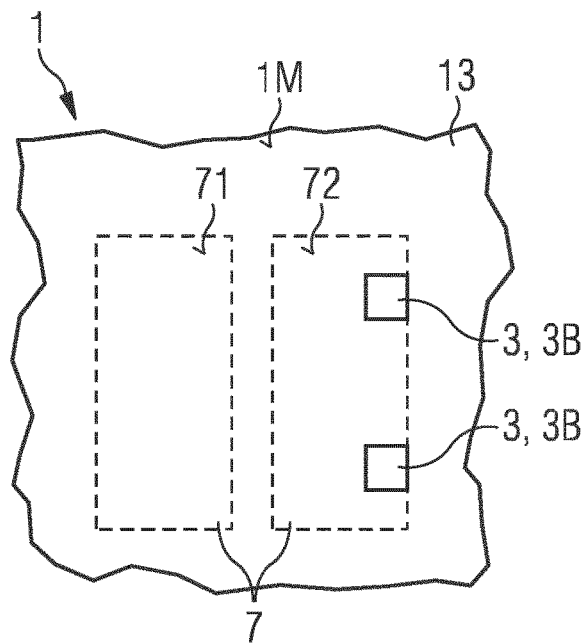

The exemplary embodiments of a carrier 1 shown in FIGS. 2B and 2C essentially correspond to the exemplary embodiment of a carrier 1 shown in FIG. 1C. In contrast, FIGS. 2B and 2C show that the carrier 1 has a first connection surface 71 and a second connection surface 72 spatially separated from the first connection surface 71. Due to the spatial separation of the connection surfaces 71 and 72, they are electrically separated from each other. The main body 2H can be applied to the mounting surface 1M such that the first contact surface 61 is in electrical contact with the first connection surface 71 and the second contact surface 62 of the main body 2H is in electrical contact with the second connection surface 72 of the carrier 1. In FIGS. 2B and 2C, only a section of the carrier 1 is shown in top view. In contrast, the carrier 1 may have a plurality of first connection surfaces 71 and a plurality of second connection surfaces 72.

According to FIG. 2B, a boundary element 3B is formed in such a way that, in top view of the mounting surface 1M, it bridges the connection surfaces 71 and 72. In other words, the boundary element 3B of the stopping structure 3 at least partially covers both the first connection surface 71 and the second connection surface 72 in top view. The boundary element 3B may be strip-shaped. The stopping structure 3 can have a plurality of such boundary elements 3B, each of which is assigned to exactly one of the first connection surfaces 71 and to exactly one of the second connection surfaces 72.

Unlike in FIG. 2B, the boundary elements 3B in FIG. 2C are point-shaped. In particular, a plurality of boundary elements 3B, such as two or more than two boundary elements 3B, are located on a single connection surface 71 or 72. As schematically shown in FIG. 2C, the neighboring connection surface 71 may be free of the boundary elements 3B. The carrier may thus comprise pairs of first and second connection surfaces 71 and 72, wherein each pair of a first connection surface 71 and a second connection surface 72 are configured to receive at least one main body 2H. One of the connection surfaces 71 or 72 may have one boundary element 3B or more boundary elements 3B disposed thereon. The other of the connection surfaces 71 or 72 of the pair may be free of being covered by the boundary element 3B or by the stopping structure 3.

Figure 3:
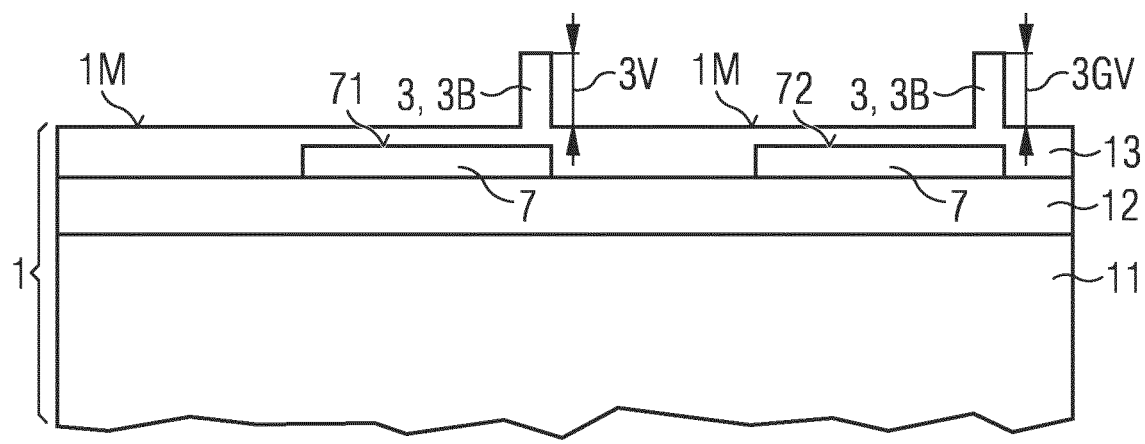
FIGS. 3 and 4 show schematic illustrations of further embodiments of a carrier of a component in sectional views.

The exemplary embodiment shown in FIG. 3 essentially corresponds to the exemplary embodiment for a carrier 1 shown in FIG. 2A. In contrast thereto, the stopping structure 3 is formed as part of the cover layer 13. The stopping structure 3 having the boundary elements 3B and the other regions of the cover layer 13 may be formed from the same material. It is possible that the cover layer 13 is formed from a photo-structurable material. The stopping structure 3 having the boundary elements 3B may be formed by exposing the photo-structurable material to light. In contrast, it is possible that the cover layer 13 is formed from another electrically insulating material.

In particular, the cover layer 13 directly adjoins the connection layers 7. For forming the cover layer 13 having the stopping structure 3 according to FIG. 3, it is possible that a first partial layer of the cover layer 13 is first applied to the base body 11 or to the intermediate layer 12 or to the connection layers 7. For forming the stopping structure 3, a second partial layer of the cover layer 13 is applied to the first partial layer, wherein the second partial layer is subsequently structured, in particular for forming the boundary elements 3B.

Figure 4:
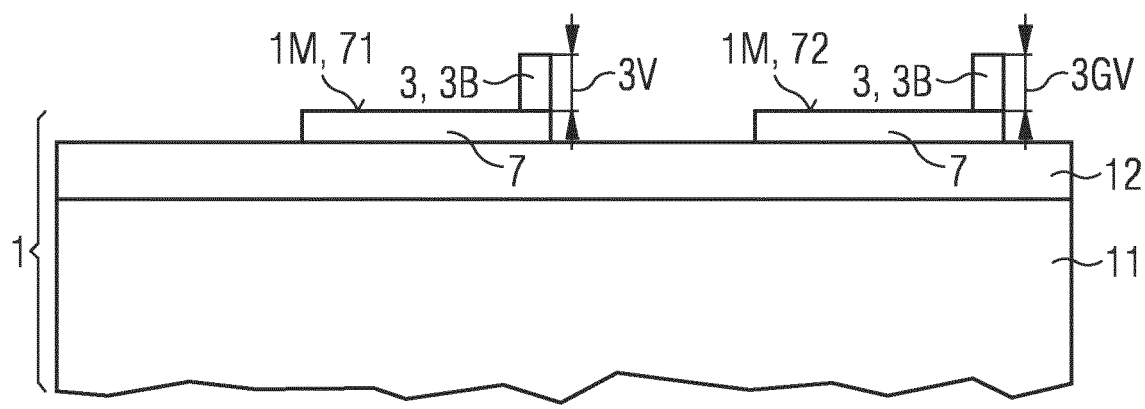

The exemplary embodiment shown in FIG. 4 essentially corresponds to the exemplary embodiment for a carrier 1 shown in FIG. 3. In contrast thereto, the stopping structure 3 is arranged directly on the connection layer 7 or on the connection layers 7. The carrier 1 is in particular free of the cover layer 13 described above. The mounting surface 1M is in particular formed by the surfaces of the connection layers 7. In particular, the connection surfaces 71 and 72 form the mounting surface 1M in regions. In this case, the connection layers 7 can have a solder layer or an electrically conductive connection layer.

The boundary elements 3B of the stopping structure 3 may be formed from an electrically conductive material or from an electrically insulating material. It is possible that the boundary elements 3B are formed from a photo-structurable material. In particular, the stopping structure 3 is formed from a photoresist layer. In any of the described embodiments, it is possible that the stopping structure is removed from the component 10 after the main body 2H is deposited or after the main bodies 2H are deposited. When a main body 2H is applied to the mounting surface 1M shown for instance in FIG. 4, a contact surface 61 or 62 may already be in direct electrical contact with the connection surface 71 or 72 at the moment when the main body 2H is applied to the mounting surface 1M. In this case, it is not necessary to pierce the cover layer 13 to form an electrical contact between the contact points of the main body 2H and the connection layers 7 of the carrier 1.

Figure 5:
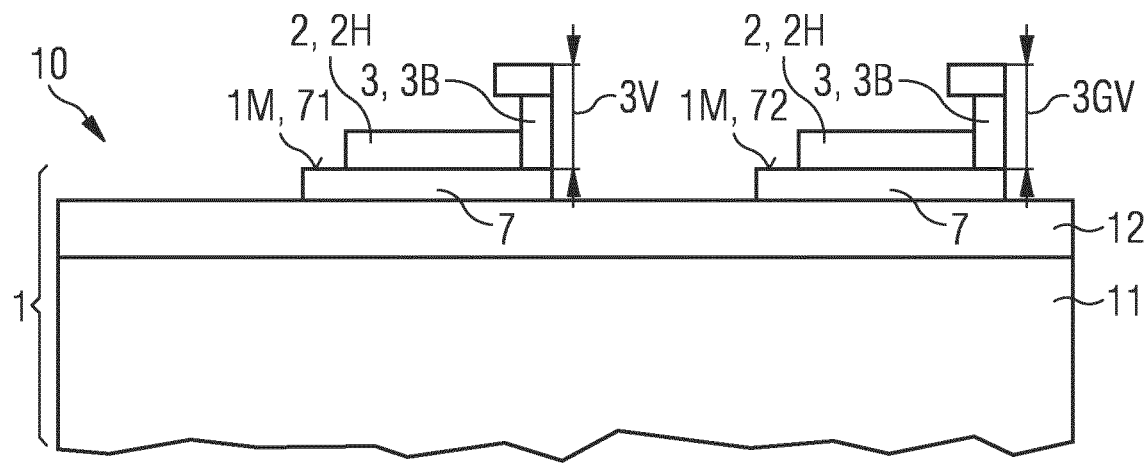
FIGS. 5 and 6 show schematic illustrations of further embodiments of a component in sectional views.

The exemplary embodiment shown in FIG. 5 is substantially the same as the exemplary embodiment shown in FIG. 4 for a carrier 1 or for a component 10. In contrast, the main bodies 2H are shown on the mounting surface 1M. Such main bodies 2H may be arranged on a carrier 1 shown in FIGS. 2A, 3 and 4.

In deviation from this, it is possible that the component 10 has a single main body 2H. If the component 10 has a plurality of main bodies 2H, the main bodies 2H of the same component 10 may be electrically conductively connected to each other or electrically insulated from each other. For example, the main bodies 2H may be individually controllable. In other words, the main bodies 2H may be individually electrically contactable. Alternatively, it is possible that the main bodies 2H are optoelectronic or electrical component parts forming an electronic system comprising light-emitting component parts, light-detecting component parts, circuits and/or control units. The main bodies 2H may be optoelectronic component parts, protection elements, circuits and/or control units.

According to FIG. 5, the stopping structure 3 has a plurality of boundary elements 3B. In top view, the boundary element 3B may partially cover the main body 2H. In particular, the boundary element 3B has a first sub-layer that is laterally adjacent, in particular directly adjacent, to the main body 2H. The boundary element 3B has a second sub-layer arranged on the first sub-layer, which, in top view, partially covers the main body 2H. In top view, the second partial layer at least partially covers the first partial layer and protrudes laterally beyond the first partial layer. In this case, the boundary element 3B has a so-called collar structure.

Figure 6:
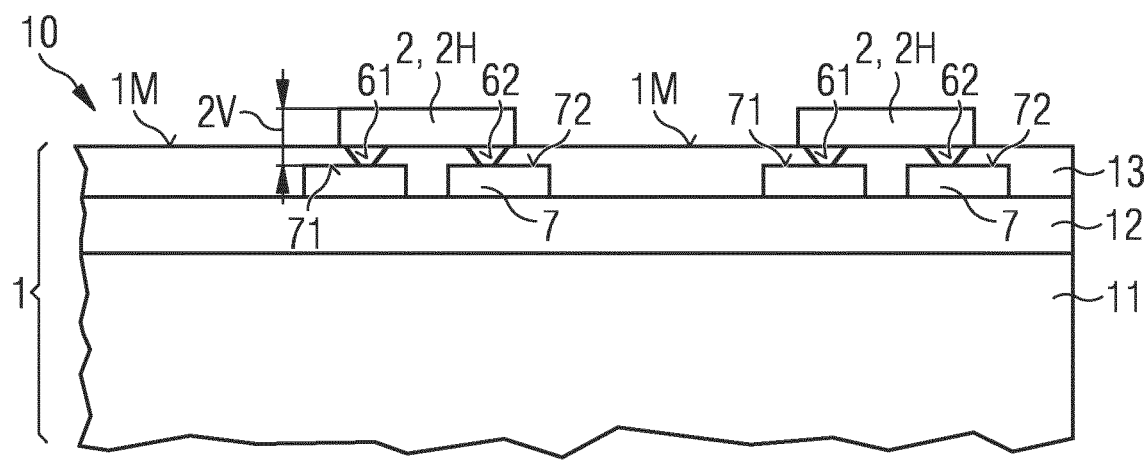

The exemplary embodiment shown in FIG. 6 essentially corresponds to the exemplary embodiment for a component 10 shown in FIG. 1F. In contrast thereto, the stopping structure 3 is no longer present in the final component 10. Furthermore, it is shown in FIG. 6 that the first contact surface 61 and the second contact surface 62 are in electrical contact with the first connection surface 71 and the second connection surface 72, respectively, wherein the first connection surface 71 and the second connection surface 72 may be assigned to different polarities of the main body 2H or of the component 10. In top view, the connection surfaces 71 and 72 may be formed in an analogous manner compared to the connection surfaces 71 and 72 shown in FIGS. 2B and 2C.

In all exemplary embodiments described here, it is possible that the connection surfaces 71 and 72 are externally electrically contactable on one side surface, on several side surfaces, on a rear side facing away from the main body 2H, in particular exclusively on the rear side of the carrier 1. If the connection surfaces 71 and 72 are electrically externally connectable exclusively at the rear side of the carrier 1, the carrier 1 can have through-contacts which are accessible at the rear side of the carrier, in deviation from FIG. 6. In particular, the through-contacts extend from the rear side of the carrier 1 throughout the base body 11 and the intermediate layer 12 to the connection layer 7 or to the connection surfaces 71 and 72.

This patent application claims the priority of the German patent application DE 10 2018 120 881.2, the disclosure content of which is hereby included by reference.

The claims are not restricted to the exemplary embodiments by the description made with reference to exemplary embodiments. The claims rather include any novel feature and any combination of features, including in particular any combination of features in the claims, even if this feature or this combination is not itself explicitly indicated in the claims or exemplary embodiments.

LIST OF REFERENCE SIGNS

10 Component
1 Carrier

11 Base body of the carrier
12 Intermediate layer of the carrier
13 Cover layer of the carrier
1M Mounting surface
1H Auxiliary carrier
2H Main body
2 Semiconductor body
2V Vertical height of the main body
25 Intermediate space
3 Stopping structure
3B Boundary element
3 Vertical height of the boundary element/Vertical height of the stopping structure
3GV Vertical total height of the boundary element/Vertical total height of the stopping structure
4 Stamp
5 Retaining structure/retaining layer
6 Contact surface
61 First contact surface
62 Second contact surface
7 Connection layer
71 First connection surface
72 Second connection surface

The invention claimed is:

1. A component comprising:
a carrier; and
at least one main body;
wherein:
the at least one main body has a semiconductor body;
the carrier has an adhesive cover layer where a surface of the adhesive cover layer comprises a mounting surface on which the at least one main body is arranged;
a stopping structure is arranged on the mounting surface and projects vertically beyond the mounting surface; and
the at least one main body is directly adjacent to the stopping structure, such that the position of the at least one main body is bounded along at least one lateral direction by the stopping structure, and
wherein:
the carrier has electrical connection surfaces;
in top view of the mounting surface, the adhesive cover layer at least partially covers the electrical connection surfaces; and
the stopping structure extends throughout the adhesive cover layer to the electrical connection surfaces.

2. The component according to claim 1, wherein the stopping structure has at least one boundary element directly adjacent to the at least one main body and has a vertical height equal to or less than a vertical height of the at least one main body.

3. The component according to claim 2, wherein a ratio of the vertical height of the boundary element or of the stopping structure to the vertical height of the at least one main body ranges from 0.4 to 1.

4. The component according to claim 1, wherein the stopping structure comprises a boundary element having a vertical height greater than a vertical height of the at least one main body, wherein the boundary element is directly adjacent to the at least one main body and at least partially covers the at least one main body in a top view of the mounting surface.

5. The component according to claim 1, wherein:
the at least one main body has electrical contact surfaces on a surface of the at least one main body facing the carrier,
the electrical contact surfaces are configured for electrically contacting the semiconductor body,
the carrier has electrical connection surfaces, and
the electrical contact surfaces of the at least one main body are electrically conductively connected to the electrical connection surfaces of the carrier.

6. The component according to claim 1, wherein:
the at least one main body comprises a plurality of main bodies arranged spaced apart from each other on the mounting surface;
the stopping structure comprises a plurality of boundary elements, and
the at least one main body is directly adjacent to one of the boundary elements such that the position of the at least one main body is bounded along at least one lateral direction by the associated boundary elements.

7. The component according to claim 1, wherein the stopping structure has a boundary element having a point-shaped, strip-shaped, or angled shape when viewed in a top view of the mounting surface.

8. A component comprising:
a carrier; and
at least one main body;
wherein:
the at least one main body has a semiconductor body;
the carrier has an adhesive cover layer where a surface of the adhesive cover layer comprises a mounting surface on which the at least one main body is arranged;
a stopping structure is arranged on the mounting surface and projects vertically beyond the mounting surface;
the at least one main body is directly adjacent to the stopping structure, such that the position of the at least one main body is bounded along at least one lateral direction by the stopping structure; and
the carrier has electrical connection surfaces,
wherein:
in top view of the mounting surface, the adhesive cover layer at least partially covers the electrical connection surfaces, and
the adhesive cover layer comprises the stopping structure; or the stopping structure is arranged directly on the adhesive cover layer and is separated from the electrical connection surfaces by the adhesive cover layer.

* * * * *